(12) United States Patent
Pourquier

(10) Patent No.: US 11,195,878 B2
(45) Date of Patent: Dec. 7, 2021

(54) OPTOELECTRONIC DEVICE COMPRISING THREE-DIMENSIONAL SEMICONDUCTOR STRUCTURES IN AN AXIAL CONFIGURATION

(71) Applicant: Aledia, Echirolles (FR)

(72) Inventor: Eric Pourquier, Grenoble (FR)

(73) Assignee: Aledia, Echirolles (FR)

( * ) Notice: Subject to any disclaimer, the term of this patent is extended or adjusted under 35 U.S.C. 154(b) by 46 days.

(21) Appl. No.: 16/626,510

(22) PCT Filed: Jun. 28, 2018

(86) PCT No.: PCT/FR2018/051604
§ 371 (c)(1),
(2) Date: Feb. 3, 2020

(87) PCT Pub. No.: WO2019/002786
PCT Pub. Date: Jan. 3, 2019

(65) Prior Publication Data
US 2021/0313497 A1    Oct. 7, 2021

(30) Foreign Application Priority Data

Jun. 30, 2017    (FR) ...................................... 1756161

(51) Int. Cl.
*H01L 27/15*    (2006.01)
*H01L 25/075*    (2006.01)
(Continued)

(52) U.S. Cl.
CPC ........ *H01L 27/156* (2013.01); *H01L 25/0753* (2013.01); *H01L 33/005* (2013.01);
(Continued)

(58) Field of Classification Search
CPC ....... H01L 33/62; H01L 33/005; H01L 33/04; H01L 33/20; H01L 25/0753; H01L 2933/0066; H01L 27/156
See application file for complete search history.

(56) References Cited

U.S. PATENT DOCUMENTS

2012/0205614 A1* 8/2012 Templier ............... H01L 27/156
257/9
2014/0209859 A1    7/2014 Cha et al.

FOREIGN PATENT DOCUMENTS

EP          2 357 676 A1    8/2011
WO    WO 2011/048318 A1    4/2011
WO    WO 2013/068125 A1    5/2013

OTHER PUBLICATIONS

International Search Report and Written Opinion for International Application No. PCT/FR2018/051604, dated Oct. 11, 2018.
(Continued)

*Primary Examiner* — Feifei Yeung Lopez
(74) *Attorney, Agent, or Firm* — Wolf, Greenfield & Sacks, P.C.

(57) ABSTRACT

An optoelectronic device including a first optoelectronic circuit bonded to a second electronic circuit. The second electronic circuit includes conductive pads. The first optoelectronic circuit includes, for each pixel: at least first and second three-dimensional semiconductor elements extending over a first conductive layer and having the same height; first active areas resting on the first semiconductor elements and capable of emitting or receiving a first electromagnetic radiation; second active areas resting on the second semiconductor elements and capable of emitting or receiving a second electromagnetic radiation; and second, third, and fourth conductive layers electrically coupled to the conductive pads, the second, third, and fourth conductive layers
(Continued)

being respectively coupled to the first active areas, to the second active areas, and to the first conductive layer.

12 Claims, 6 Drawing Sheets

(51) Int. Cl.
    *H01L 33/00*     (2010.01)
    *H01L 33/04*     (2010.01)
    *H01L 33/20*     (2010.01)
    *H01L 33/62*     (2010.01)

(52) U.S. Cl.
    CPC .............. *H01L 33/04* (2013.01); *H01L 33/20* (2013.01); *H01L 33/62* (2013.01); *H01L 2933/0066* (2013.01)

(56) References Cited

OTHER PUBLICATIONS

International Preliminary Report on Patentability for International Application No. PCT/FR2018/051604, dated Jan. 9, 2020.

\* cited by examiner

OPTOELECTRONIC DEVICE COMPRISING THREE-DIMENSIONAL SEMICONDUCTOR STRUCTURES IN AN AXIAL CONFIGURATION

RELATED APPLICATIONS

This Application is a national stage filing under 35 U.S.C. 371 of International Patent Application Serial No. PCT/FR2018/051604, filed Jun. 28, 2018, which claims priority to French patent application FR17/56161. The entire contents of these applications are incorporated herein by reference in their entirety.

BACKGROUND

The present invention generally concerns optoelectronic devices comprising three-dimensional semiconductor elements of nanowire or microwire type, and a method of manufacturing the same, and more particularly optoelectronic devices capable of displaying images, particularly a display screen or an image projection device.

DISCUSSION OF THE RELATED ART

A pixel of an image corresponds to the unit element of the image displayed or captured by the optoelectronic device. For the display of color images, the optoelectronic device generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display subpixels used to display a pixel of an image is called display pixel of the optoelectronic device.

There exist optoelectronic devices comprising three-dimensional semiconductor elements of nanowire or microwire type enabling to form so-called three-dimensional light-emitting diodes. A light-emitting diode comprises an active area which is the region of the light-emitting diode most of the electromagnetic radiation supplied by the light-emitting diode is emitted therefrom. A three-dimensional light-emitting diode may be formed in a so-called radial configuration, also called core/shell configuration, where the active area is formed at the periphery of the three-dimensional semiconductor element. It may also be formed in a so-called axial configuration, where the active area does not cover the periphery of the three-dimensional semiconductor element but essentially extends along a longitudinal epitaxial growth axis.

Three-dimensional light-emitting diodes in an axial configuration have an emission surface area smaller than that of light-emitting diodes in a radial configuration, but have the advantage of being made of a semiconductor material of better crystalline quality, thus providing a higher internal quantum efficiency, particularly due to a better relaxation of the stress at the interfaces between semiconductor layers. In the case of quantum wells made of InGaN, three-dimensional light-emitting diodes in an axial configuration thus enable to incorporate more indium to emit, for example, in red or green.

There is a need to form an optoelectronic device with display pixels having a decreased lateral dimension, particularly smaller than 5 µm. However, the forming of such an optoelectronic device with three-dimensional light-emitting diodes in an axial configuration may be difficult. It would further be desirable for the optoelectronic device manufacturing method to comprise the greatest possible number of steps common with a method of manufacturing an optoelectronic device comprising planar light-emitting diodes where the active areas of the light-emitting diodes are formed on planar layers.

SUMMARY

Thus, an object of an embodiment is to at least partly overcome the disadvantages of the previously-described optoelectronic devices comprising three-dimensional light-emitting diodes.

Another object of an embodiment is for the three-dimensional light-emitting diodes to be in an axial configuration.

Another object of an embodiment is for the lateral dimensions of the display pixels of the optoelectronic device to be smaller than 5 µm, preferably smaller than 4 µm.

Another object of an embodiment is for the steps of the method of manufacturing the optoelectronic device after the manufacturing of the light-emitting diodes to be compatible with methods of manufacturing CMOS transistors of integrated circuits.

Thus, an embodiment provides an optoelectronic device comprising a first optoelectronic circuit bonded to a second electronic circuit, the second electronic circuit comprising electrically-conductive pads, the first optoelectronic circuit comprising pixels and comprising, for each pixel:

a first electrically-conductive layer;

at least first and second three-dimensional semiconductor elements extending perpendicularly to the first electrically-conductive layer and in contact with the first electrically-conductive layer and having the same height measured perpendicularly to the first electrically-conductive layer;

first active areas resting on the ends of the first three-dimensional semiconductor elements opposite to the first electrically-conductive layer and capable of emitting or of receiving a first electromagnetic radiation at a first wavelength;

second active areas resting on the ends of the second three-dimensional semiconductor elements opposite to the first electrically-conductive layer and capable of emitting or of receiving a second electromagnetic radiation at a second wavelength different from the first wavelength; and second, third, and fourth electrically-conductive layers electrically coupled to the electrically-conductive pads, the second electrically-conductive layer being coupled to the first active areas, the third electrically-conductive layer being coupled to the second active areas, and the fourth electrically-conductive layer being coupled to the first electrically-conductive layer.

According to an embodiment, the diameter of each first semiconductor element in contact with the first electrically-conductive layer is smaller than the diameter of each second semiconductor element in contact with the first electrically-conductive layer.

According to an embodiment, the first three-dimensional semiconductor elements are regularly distributed according to a first mean pitch and the second three-dimensional semiconductor elements are regularly distributed according to a second mean pitch different from the first mean pitch.

According to an embodiment, the first optoelectronic circuit further comprises, for each pixel:

at least third three-dimensional semiconductor elements extending perpendicularly to the first electrically-conductive layer and in contact with the first electrically-conductive layer, the first, second, and third three-dimensional semiconductor elements having the same height measured perpendicularly to the first electrically-conductive layer;

third active areas resting on the ends of the third three-dimensional semiconductor elements opposite to the first electrically-conductive layer and capable of emitting or of receiving an electromagnetic radiation at a third wavelength different from the first and second wavelengths; and a fifth electrically-conductive layer electrically coupled to one of the electrically-conductive pads and coupled to the third active areas.

According to an embodiment, the diameter of each second semiconductor element in contact with the first electrically-conductive layer is smaller than the diameter of each third semiconductor element in contact with the first electrically-conductive layer.

According to an embodiment, the third three-dimensional semiconductor elements are regularly distributed according to a third mean pitch different from the first mean pitch and from the second mean pitch.

According to an embodiment, the first and second active areas comprise a single quantum well or multiple quantum wells.

According to an embodiment, the first and second three-dimensional semiconductor elements are mainly made of a semiconductor material selected from the group comprising III-V compounds, II-VI compounds, or group-IV semiconductors or compounds.

According to an embodiment, the first and second three-dimensional semiconductor elements have a wire, conical or frustoconical shape.

According to an embodiment, the maximum dimension of each pixel measured parallel to the first electrically-conductive layer is smaller than 5 µm.

An embodiment also provides a method of manufacturing the optoelectronic device such as previously defined, comprising the successive steps of:

a) forming the first optoelectronic circuit; and b) bonding the first optoelectronic circuit to a second electronic circuit by electrically coupling the second, third, and fourth electrically-conductive layers to the electrically-conductive pads.

According to an embodiment, step a) comprises the successive steps of:

c) simultaneously forming on a support the first and second three-dimensional semiconductor elements;

d) simultaneously forming the first active areas on the ends of the first three-dimensional semiconductor elements opposite to the support and the second active areas on the ends of the second three-dimensional semiconductor elements opposite to the support;

e) forming the second, third, and fourth electrically-conductive layers;

f) removing the support; and g) forming the first electrically-conductive layer.

According to an embodiment, step a) comprises the steps of, between steps c) and d):

h) forming an electrically-insulating layer between the first three-dimensional semiconductor elements and between the second three-dimensional semiconductor elements;

i) partially etching the electrically-insulating layer and the first and second three-dimensional semiconductor elements so that the first and second three-dimensional semiconductor elements have the same height.

According to an embodiment, the method further comprises, between steps f) and g), the step of etching the electrically-insulating layer and the first and second three-dimensional semiconductor elements on the side opposite to the first and second active areas.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
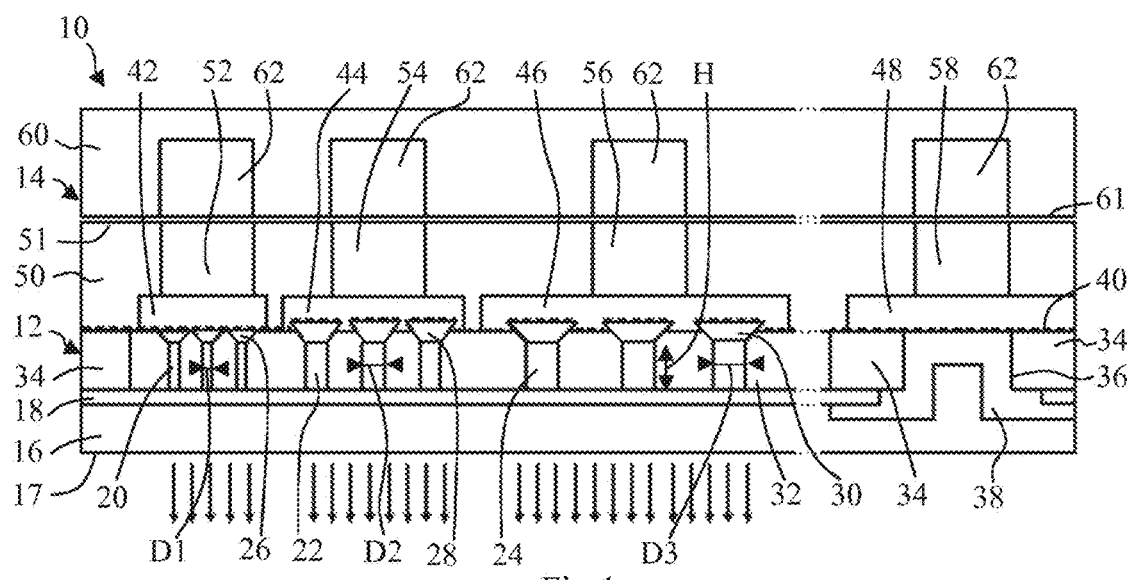
FIG. 1 is a partial simplified cross-section view of an embodiment of an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the control means of the light-emitting diodes of the optoelectronic device are well known and will not be described.

In the following description, when reference is made to terms qualifying the relative position, such as term "top", "bottom", "upper", "lower", etc., reference is made to the orientation of the drawings or to an optoelectronic device in a normal position of use. Unless otherwise specified, expressions "about", "approximately", and "in the order of" mean to within 10%, preferably to within 5%.

The present application particularly relates to optoelectronic devices comprising three-dimensional elements, for example, microwires, nanowires, conical elements, or frustoconical elements. In particular, a conical or frustoconical element may be a circular conical or frustoconical element or a pyramidal conical or frustoconical element. In the following description, embodiments are particularly described for optoelectronic devices comprising microwires or nanowires. However, such embodiments may be implemented for three-dimensional elements other than microwires or nanowires, for example, conical or frustoconical three-dimensional elements.

Term "microwire", "nanowire", "conical element", or "frustoconical element" designates a three-dimensional structure having a shape elongated along a preferred direction, having at least two dimensions, called minor dimensions, in the range from 5 nm to 2.5 µm, preferably from 50 nm to 1 µm, the third dimension, called major dimension, being greater than or equal to 1 time, preferably greater than or equal to 5 times, the largest minor dimension.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter. The wire diameter is here defined as being a quantity associated with the perimeter of the wire at the level of a cross-section. It may be the diameter of a disk having the same surface area as the wire cross-section. The local diameter, also called diameter hereafter, is the wire diameter at a given height thereof along the wire axis. The mean diameter is the mean, for example, arithmetic, of the local diameters along the wire or a portion thereof.

FIG. 1 is a partial simplified cross-section view of an optoelectronic device 10 formed from wires such as previously described and capable of emitting an electromagnetic radiation. According to an embodiment, an optoelectronic device 10 comprising at least two integrated circuits 12 and 14, also called chips, is provided. First integrated circuit 12 comprises light-emitting diodes. Second integrated circuit 14 comprises electronic components, particularly transistors, used to control the light-emitting diodes of first integrated circuit 12. First integrated circuit 12 is bonded to the second integrated circuit, for example, by molecular bonding or by a flip-chip-type bond, particularly a ball or microtube flip-chip method. First integrated circuit 12 is called optoelectronic circuit or optoelectronic chip in the following description and second integrated circuit 14 is called control circuit or control chip in the following description.

Preferably, optoelectronic chip 12 only comprises light-emitting diodes and elements of connection of these light-emitting diodes and control chip 14 comprises all the electronic components necessary to control the light-emitting diodes of the optoelectronic chip. As a variation, optoelectronic chip 12 may also comprise other electronic components in addition to the light-emitting diodes.

FIG. 1 shows, in its left-hand portion, the elements of optoelectronic chip 12 for a display pixel, the structure being repeated for each display pixel, and, in its right-hand portion, elements adjacent to the display pixels and which may be common to a plurality of display pixels.

Optoelectronic chip 12 comprises, from bottom to top in FIG. 1:

an electrically-insulating layer 16, at least partially transparent to the electromagnetic radiation emitted by the light-emitting diodes and which delimits a surface 17;

an electrically-conductive layer 18, at least partially transparent to the electromagnetic radiation emitted by the light-emitting diodes;

first wires 20 (three first wires being shown), having a height H and a diameter D1, second wires 22 (three second wires being shown) having a height H and a diameter D2, and third wires 24 (three second wires being shown) having a height H and a diameter D3, the first, second, and third wires having parallel axes perpendicular to surface 17, extending from conductive layer 18 and in contact with conductive layer 18, diameter D1 being smaller than diameter D2 and diameter D2 being smaller than diameter D3;

a first head 26 at the end of each first wire 20 opposite to conductive layer 18, a second head 28 at an end of each second wire 22 opposite to conductive layer 18, and a third head 30 at an end of each third wire 24 opposite to conductive layer 18;

an electrically-insulating layer 32 of a first electrically-insulating material between wires 20, 22, 24 having a thickness substantially equal to the sum of height H and of the dimension of head 26 measured along the wire axis;

an electrically-insulating layer 34 of a second electrically-insulating material, which may be different from the first insulating material or identical to the first insulating material, extending around first insulating layer 32 and of same thickness as insulating layer 32;

an opening 36 extending through insulating layer 34 across the entire thickness of insulating layer 34;

an electrically-conductive layer 38 extending in opening 36 and being in contact with conductive layer 18;

separate portions 40 of an electrically-conductive material on insulating layer 32, insulating layer 34, conductive layer 38, and the portions of heads 26, 28, and 30 protruding from insulating layer 32 and particularly in contact with the portions of heads 26, 28, and 30 protruding from insulating layer 32;

distinct electrically-conductive layers 42, 44, 46, 48, conductive layer 42 being in contact with first heads 26, conductive layer 44 being in contact with second heads 28, conductive layer 46 being in contact with third heads 30, and conductive layer 48 being in contact with conductive layer 38;

an electrically-insulating layer 50 covering conductive layers 42, 44, 46, and 48 and extending between conductive layers 42, 44, 46, and 48 and delimiting a surface 51, preferably substantially planar; and electrically-conductive pads 52, 54, 56 58 capable of having a multilayer structure, extending through insulating layer 50 and flush with surface 51, conductive pad 52 being in contact with conductive layer 42, conductive pad 54 being in contact with conductive layer 44, conductive pad 56 being in contact with conductive layer 46, and conductive pad 58 being in contact with conductive layer 48.

Control chip 14 particularly comprises on the side of optoelectronic chip 12 an electrically-insulating layer 60 delimiting a surface 61, preferably substantially planar, and conductive pads 62 flush with surface 61, conductive pads 62 being electrically coupled to conductive pads 52, 54, 56, 58. In the case where control chip 14 is bonded to optoelectronic chip 12 by molecular bonding, conductive pads 62 may be in contact with conductive pads 52, 54, 56, 58. In the case where control chip 14 is bonded to optoelectronic chip 12 by a flip-chip-type bond, solder balls or microtubes may be interposed between conductive pads 62 and conductive pads 52, 54, 56, 58.

FIGS. 2 to 8 are detail view of embodiments of head 26. Heads 28 and 30 may have a structure similar to that of head 26.

Figure 2:
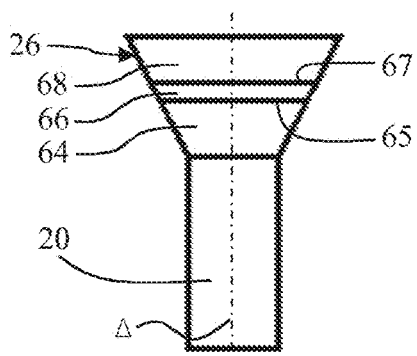
FIG. 2 is a detail view of a portion of FIG. 1.

In FIG. 2, head 26 successively comprises, from wire 20 along axis Δ of wire 20:

a semiconductor portion 64 of the same material as wire 20 and doped with a first conductivity type, for example, type N;

an active area 66; and a doped semiconductor portion 68 of a second conductivity type, for example, type P.

A passivation layer, not shown, may be present on the lateral sides of active area 66 and of semiconductor portions 64, 68.

The assembly formed by each wire 20, 22, 24 and the associated head 26, 28, 30 forms a wire-shaped elementary light-emitting diode in axial configuration. Head 26, 28, 30 particularly comprises an active area 66, which is the layer having most of the electromagnetic radiation delivered by light-emitting diode emitted therefrom. According to an example, active area 66 may comprise confinement means, such as multiple quantum wells.

The light-emitting diode is said to be in an axial configuration since active area 66 essentially coats a surface 65 of semiconductor portion 64 substantially orthogonal to axis Δ and extends along axis Δ. Further, semiconductor portion 68 essentially coats an upper surface 67 of active area 66 substantially orthogonal to axis Δ and extends along axis Δ.

In the embodiment shown in FIG. 2, the cross-section area of head 26 increases as the distance from wire 20 increases and the semiconductor portions 68 of adjacent light-emitting diodes are distinct. According to another embodiment, the semiconductor portions 68 of adjacent light-emitting diodes may coalesce.

Figure 3:
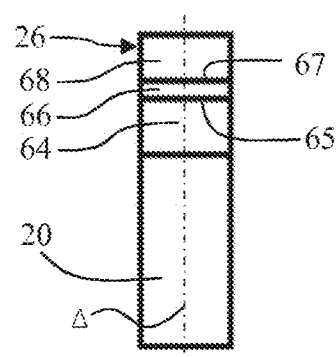
FIGS. 3 to 7 are views similar to FIG. 2 of other embodiments of the optoelectronic device.

FIG. 3 is a view similar to FIG. 2 of another embodiment where the cross-section area of head 26 is substantially constant.

Figure 4:
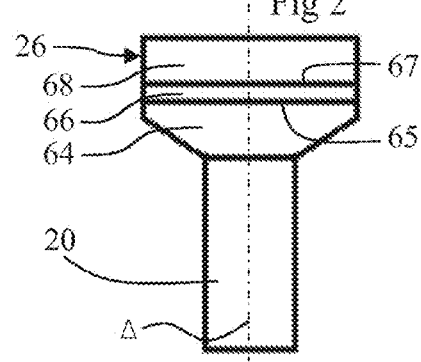

FIG. 4 is a view similar to FIG. 2 of another embodiment where the cross-section area of head 26 increases as the distance from wire 20 increases and then remains substantially constant, active area 66 being located at the level of the portion of constant cross-section area of head 26.

Figure 5:
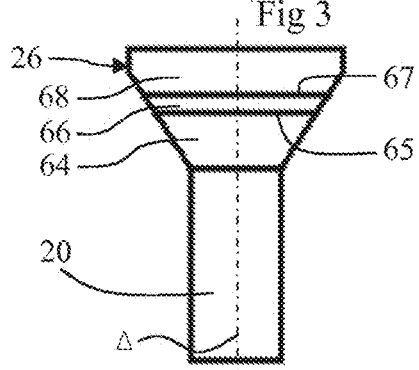

FIG. 5 is a view similar to FIG. 4 of another embodiment where the cross-section area of head 26 increases as the distance from wire 20 increases and then remains substantially constant, active area 66 being located at the level of the portion of constant cross-section area of head 26.

Figure 6:
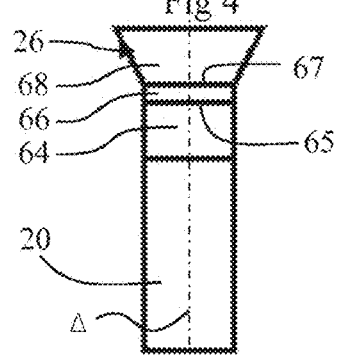

FIG. 6 is a view similar to FIG. 2 of another embodiment where the cross-section area of head 26 is substantially constant for semiconductor portion 64 and active area 66 and increases for semiconductor portion 68 as the distance from wire 20 increases.

According to an embodiment, each display pixel Pix comprises at least two types of light-emitting diodes. According to an embodiment, the light-emitting diodes of the first type, for example comprising wires 20 and heads 26, are capable of emitting a first radiation at a first wavelength and the light-emitting diodes of the second type, for example comprising wires 22 and heads 28, are capable of emitting a second radiation at a second wavelength. According to an embodiment, each display pixel Pix comprises at least three types of light-emitting diodes, the light-emitting diodes of the third type, for example comprising wires 24 and heads 30, being capable of emitting a third radiation at a third wavelength. The first, second, and third wavelengths may be different.

According to an embodiment, especially in the case where face 65 of semiconductor portion 64 corresponds to a crystallographic plane C only, the wavelength of the radiation emitted by active area 66 increases when the diameter of the wire 20, 22, 24, on which active area 66 rests decreases. According to an embodiment, the third wavelength corresponds to blue light and is within the range from 430 nm to 490 nm. According to an embodiment, the second wavelength corresponds to green light and is within the range from 510 nm to 570 nm. According to an embodiment, the first wavelength corresponds to red light and is within the range from 600 nm to 720 nm. This is surprising insofar as it is generally disclosed that, when active zone 66 grows on semi-polar crystallographic planes, the wavelength of the radiation emitted by the active area increases when the diameter of the wire, on which the active area 66 rests, increases.

According to an embodiment, each display pixel Pix comprises light-emitting diodes of a fourth type, the light-emitting diodes of the fourth type being capable of emitting a fourth radiation at a fourth wavelength. The first, second, third, and fourth wavelengths may be different. According to an embodiment, the fourth wavelength corresponds to yellow light and is in the range from 570 nm to 600 nm.

For each display pixel, the elementary light-emitting diodes having wires of same diameter have a common electrode and when a voltage is applied between conductive layer 18 and conductive layer 42, 44, or 46, a light radiation is emitted by the active areas of these elementary light-emitting diodes.

In the present embodiment, the electromagnetic radiation emitted by each light-emitting diode escapes from optoelectronic device 12 through surface 17. Preferably, each conductive layer 42, 44, 46 is reflective and advantageously enables to increase the proportion of the radiation emitted by the light-emitting diodes which escapes from optoelectronic device 10 through surface 17.

Optoelectronic chip 12 and control chip 14 being stacked, the lateral bulk of optoelectronic device 10 is decreased. According to an embodiment, the lateral dimension of a display pixel, measured perpendicularly to the wire axes, is smaller than 5 µm, preferably smaller than 4 µm, for example, approximately 3 µm. Further, optoelectronic chip 12 may have the same dimensions as control chip 14. Thereby, the compactness of optoelectronic device 10 may advantageously be increased.

Conductive layer 18 is capable of biasing the active areas of heads 26, 28, 30 and of giving way to the electromagnetic radiation emitted by the light-emitting diodes. The material forming conductive layer 18 may be a transparent conductive material such as graphene or a transparent conductive oxide (TCO), particularly indium tin oxide (ITO), zinc oxide doped or not with aluminum, or with gallium, or with boron. As an example, conductive layer 18 has a thickness in the range from 20 nm to 500 nm, preferably from 20 nm to 100 nm.

Conductive layer 38, conductive layers 42, 44, 46, 48, and conductive pads 52, 54, 56, 58 may be made of metal, for example, of aluminum, silver, copper, gold, or ruthenium, or of an alloy of at least two of these compounds. Conductive layer 38 may have a thickness in the range from 100 nm to 3 µm. Conductive portions 42, 44, 46, 48 may have a thickness in the range from 100 nm to 2 µm. The minimum lateral dimension, in a plane perpendicular to surface 17, is in the range from 150 nm to 1 µm, for example, approximately 0.25 µm. Conductive pads 52, 54, 56, 58 may have a thickness in the range from 0.5 µm to 2 µm.

Each of insulating portion 16, 32, 34, and 50 is made of a material selected from the group comprising silicon oxide ($SiO_2$), silicon nitride ($Si_xN_y$, where x is approximately equal to 3 and y is approximately equal to 4, for example, $Si_3N_4$), silicon oxynitride (particularly of general formula $SiO_xN_y$, for example, $Si_2ON_2$), hafnium oxide ($HfO_2$), or aluminum oxide ($Al_2O_3$). According to an embodiment, insulating layer 74 is made of silicon oxide and insulating layer 76 is made of silicon nitride. The thickness of each insulating layer 74, 76 is in the range from 10 nm to 100 nm, preferably from 20 nm to 60 nm, particularly equal to approximately 40 nm. Insulating layer 16 may have a maximum thickness in the range from 100 nm to 5 µm. Insulating layers 32 and 34 may have a maximum thickness in the range from 0.5 µm to 2 µm. Insulating layer 50 may have a maximum thickness in the range from 0.5 µm to 2 µm.

Conductive portions 40 are made of a material which is a good electric conductor and which at the same time has a better resistance of contact with the material forming the upper layer of heads 26, 28, 30 than the material forming conductive layers 42, 44, 46, 48. Conductive portions 40 are for example made of nickel (Ni). Conductive portions 40 may have a thickness in the range from 0.5 nm to 10 nm. Conductive portions 40 enable to obtain a lightly-resistive contact between heads 26, 28, 30 and conductive layers 42, 44, 46.

Each wire 20, 22, 24 and each semiconductor portion 64, 68 is at least partly formed from at least one semiconductor material. According to an embodiment, the semiconductor material is selected from the group comprising III-V compounds, II-VI compounds, or group-IV semiconductors or compounds.

Wires 20, 22, 24 and semiconductor portions 64, 68 may be at least partly made up of a first semiconductor material mainly comprising a III-V compound, for example, a III-N compound, a II-VI compound, or at least a group-IV compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions. Examples of group-IV semiconductor materials are silicon (Si), carbon (C), germanium (Ge), silicon carbide alloys (SiC), silicon-germanium alloys (SiGe), or germanium carbide alloys (GeC). The semiconductor material of wires 20, 22, 24, and/or of semiconductor portions 64, 68 may comprise a dopant, for example, silicon providing an N-type doping of a III-N compound, or magnesium providing a P-type doping of a III-N compound.

Each wire 20, 22 24 may have an elongated semiconductor structure along an axis substantially perpendicular to surface 17. Each wire 20, 22, 24 may have a generally cylindrical shape. The axes of two adjacent wires 20, 22, 24 may be distant by from 100 nm to 3 µm and preferably from 200 nm to 1.5 µm. The height H of each wire 20, 22, 24 may be in the range from 150 nm to 10 µm, preferably from 200 nm to 1 µm, more preferably from 250 nm to 750 nm. The mean diameter of each wire 20, 22, 24 may be in the range from 50 nm to 10 µm, preferably from 100 nm to 2 µm, more preferably from 120 nm to 1 µm.

The cross-section of wires 20, 22, 24 may have different shapes, such as, for example, an oval, circular, or polygonal, particularly triangular, rectangular, square, or hexagonal, shape.

Active area 66 may comprise at least one quantum well, comprising a layer of a second semiconductor material having a bandgap energy smaller than that of semiconductor portion 64 and of semiconductor portion 68, preferably interposed between two barrier layers, thus improving the charge carrier confinement. The second semiconductor material may comprise the III-V, II-VI, or IV compound of doped semiconductor portions 64, 68 having at least one additional element incorporated therein. As an example, in the case of a wire 20, 22, 24 made up of GaN, the second material forming the quantum well is preferably InGaN. The atomic percentage of the additional element is a function of the desired optical properties and of the emission spectrum of the wire. Active area 66 may be formed of a single quantum well or of a plurality of quantum wells.

According to a preferred embodiment, each wire 20, 22, 24 is made up of GaN, the quantum well(s) of active area 66 being made of InGaN. The emission wavelength of active area 66 particularly depends on the proportion of indium in the quantum well(s). Semiconductor portion 64 may be made of GaN and be doped with the first conductivity type, for example, type N, particularly with silicon. The height of semiconductor portion 64, measured along axis Δ, may be in the range from 10 nm to 1 µm, for example, in the range from 20 nm to 200 nm. Active area 66 may comprise one or a plurality of quantum wells, for example, made of InGaN. Active area 66 may comprise a single quantum well which continuously extends along axis Δ between semiconductor portions 64, 68. As a variation, it may comprise multiple quantum wells and is then formed of an alternation, along axis Δ, of quantum wells for example made of InGaN, and of barrier layers for example made of GaN. The height of active area 66, measured along axis Δ, may be in the range from 10 nm to 500 nm, for example, in the range from 20 nm to 100 nm. Semiconductor portion 68 may be made of GaN and be doped with the second conductivity type opposite to the first type, for example, type P, particularly with magnesium. The height of semiconductor portion 68 may be in the range from 50 nm to 5 µm, for example, in the range from 100 nm to 1 µm. Semiconductor portion 68 may comprise an electron blocking layer located at the interface with active area 66. Electron blocking layer may be made of a ternary III-N compound, for example, AlGaN or AlInN, advantageously P-type doped. It enables to increase the radiative recombination rate within active area 66.

In the embodiments shown in FIGS. 2 to 7, the layers forming active area 66 are stacked along axis Δ.

Figure 7:
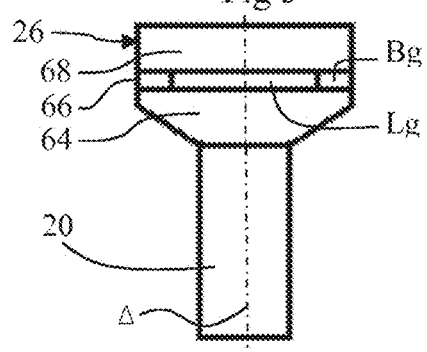

FIG. 7 is a view similar to FIG. 4 of another embodiment where active area 66 comprises a central portion Lg of a semiconductor material having a first bandgap and a peripheral portion Bg arranged around the central portion along axis Δ and in contact with the central portion, the peripheral portion being made of a semiconductor material having a second bandgap higher than the first bandgap.

Figure 8A:
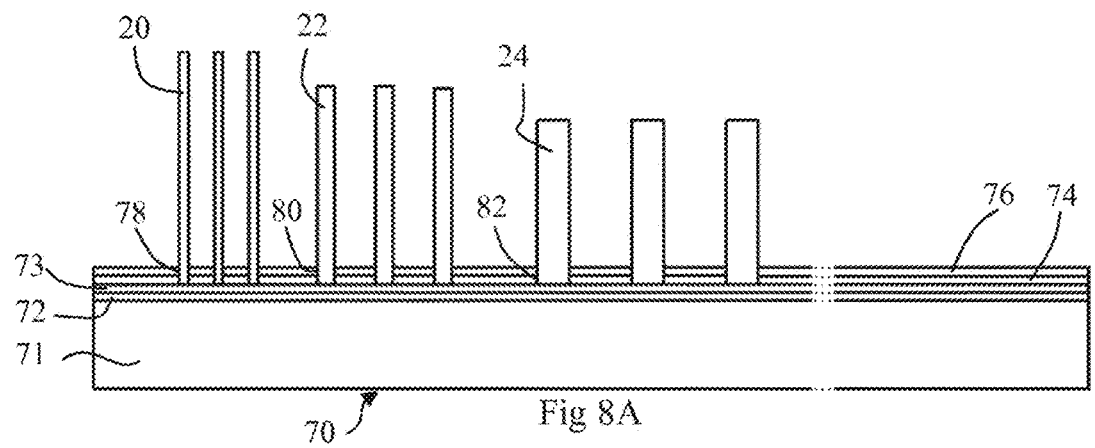
FIGS. 8A to 8Q are partial simplified cross-section views of the structures obtained at successive steps of an embodiment of a method of manufacturing the optoelectronic device of FIG. 1.
Figure 8B:
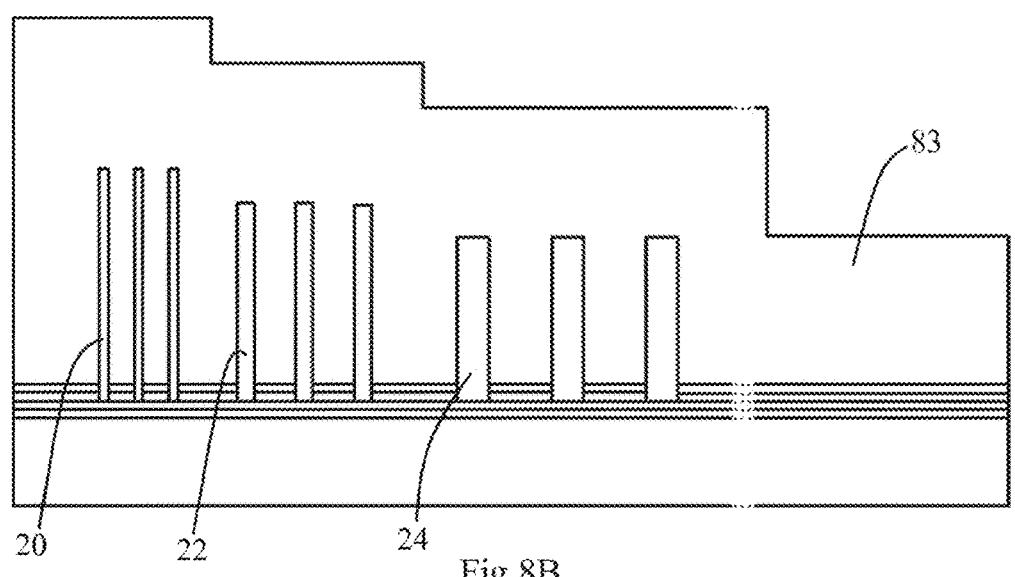
Figure 8C:
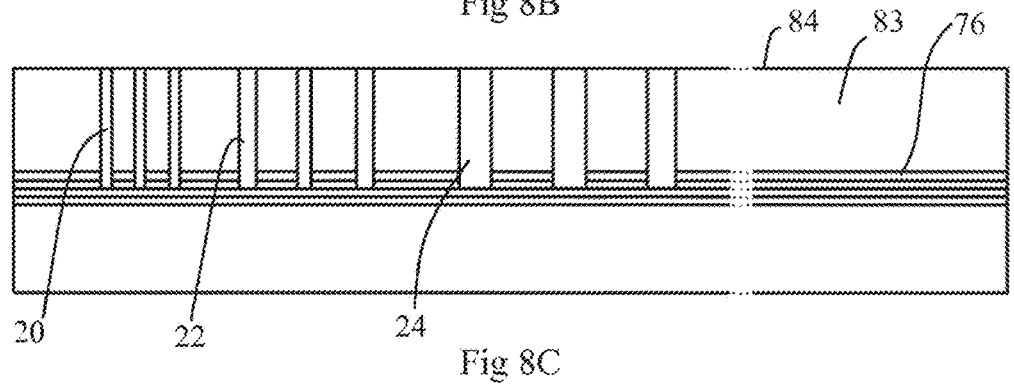
Figure 8D:
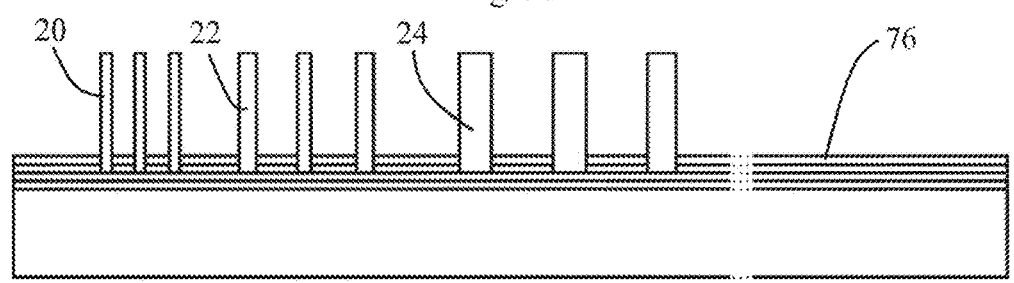
Figure 8E:
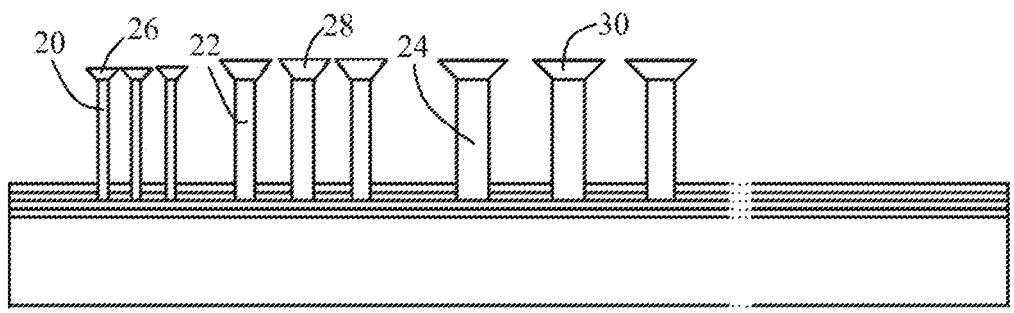
Figure 8F:
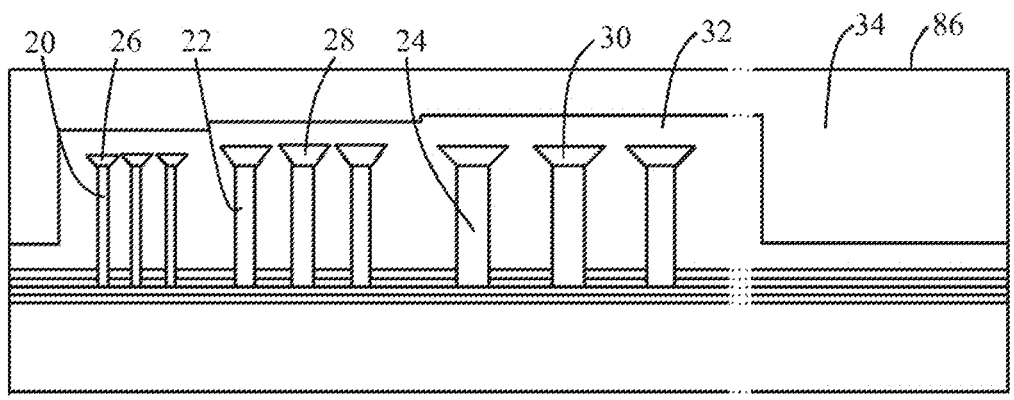
Figure 8G:
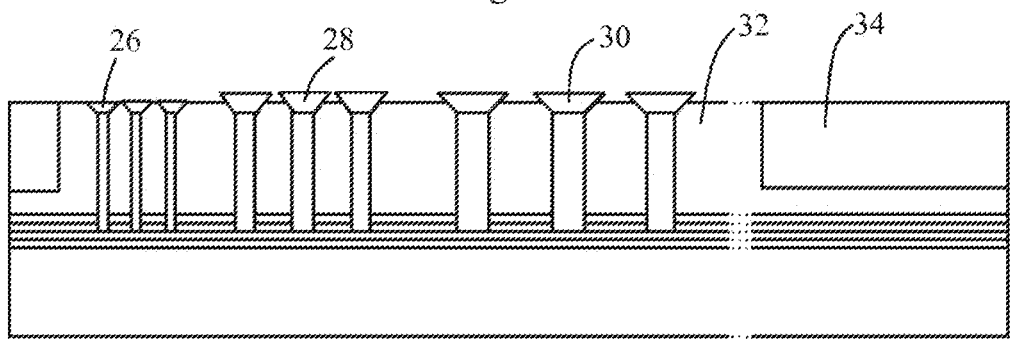
Figure 8H:
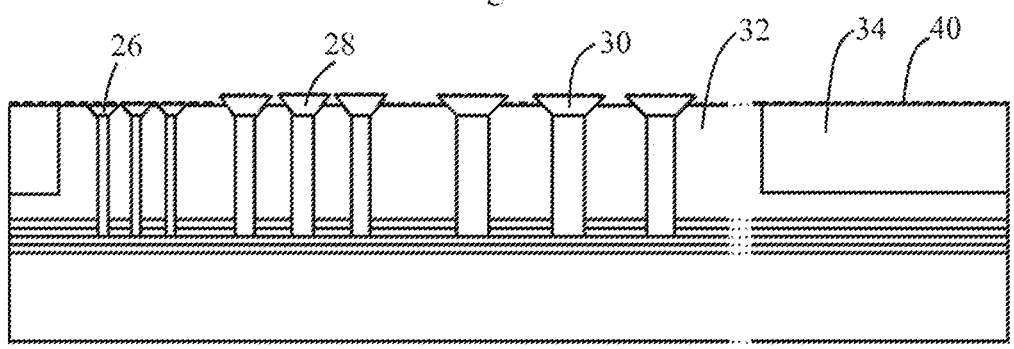
Figure 8I:
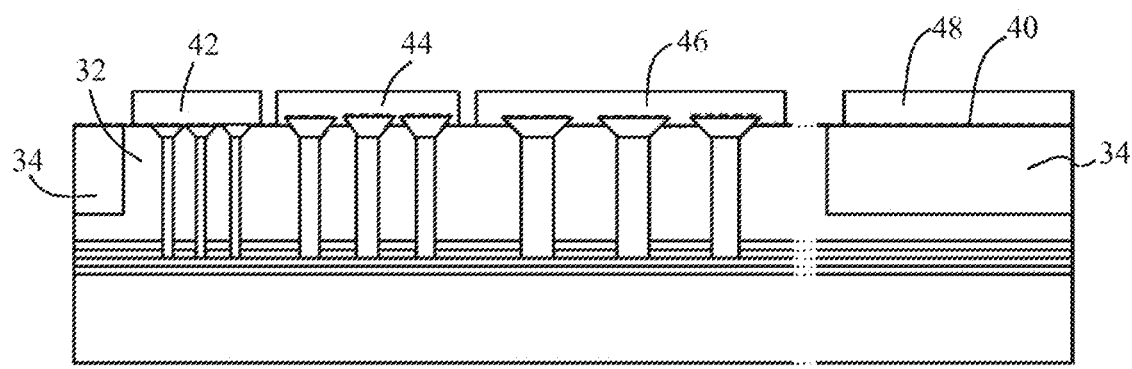
Figure 8J:
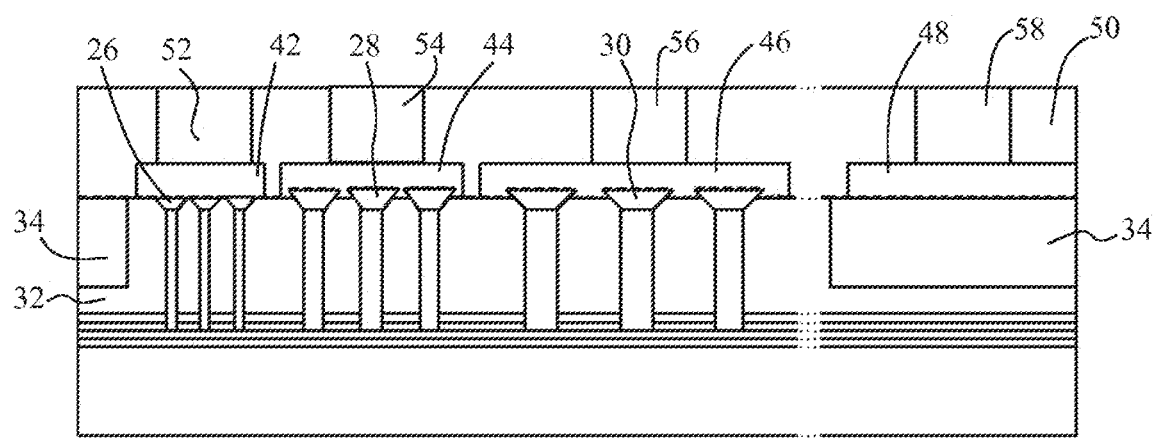
Figure 8K:
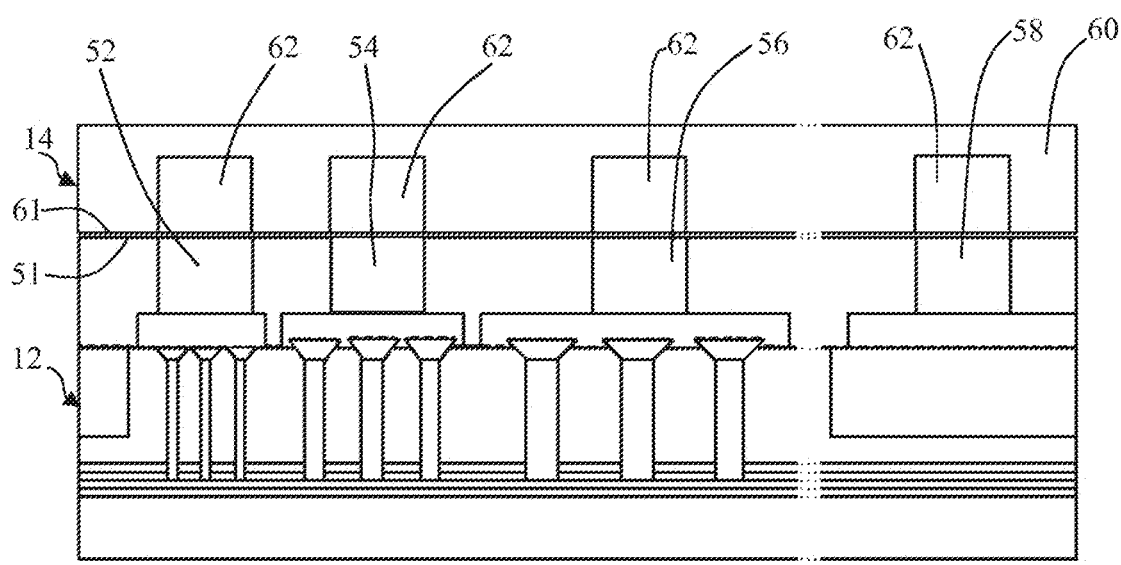
Figure 8L:
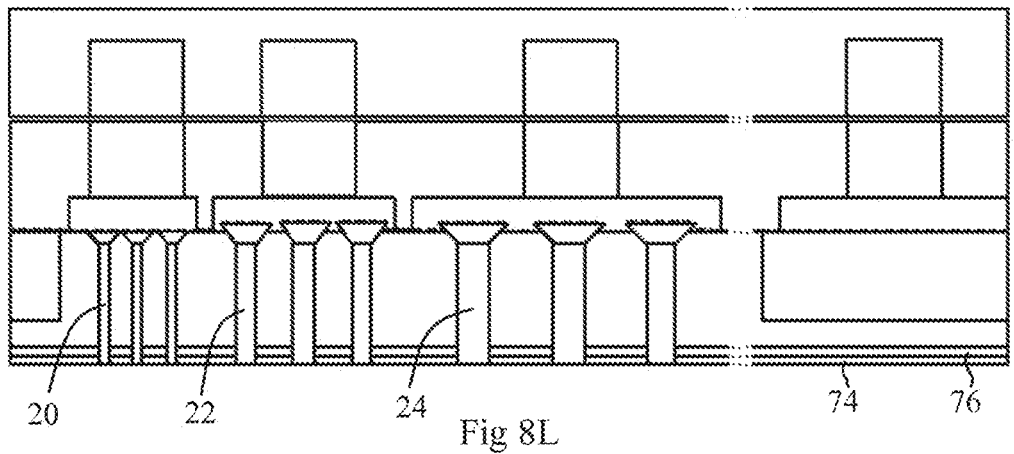
Figure 8M:
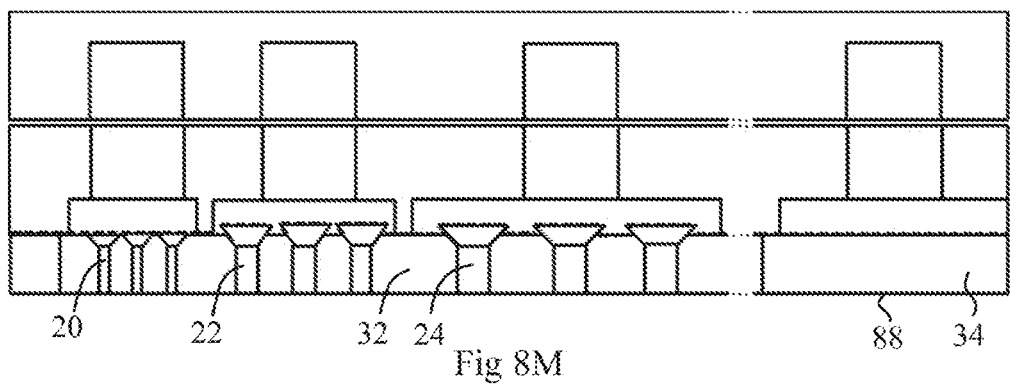
Figure 8N:
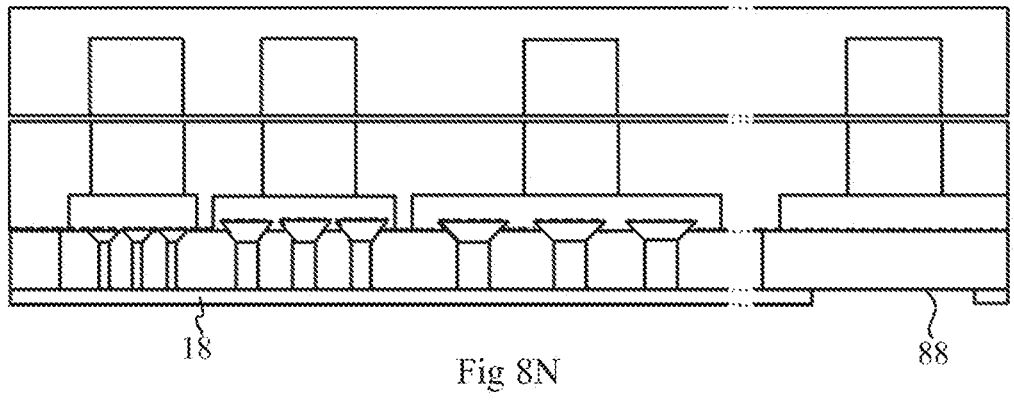
Figure 8O:
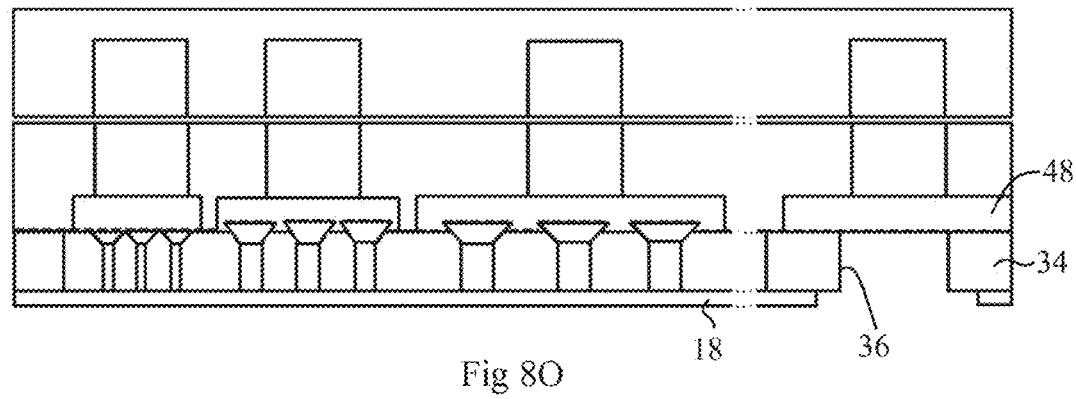
Figure 8P:
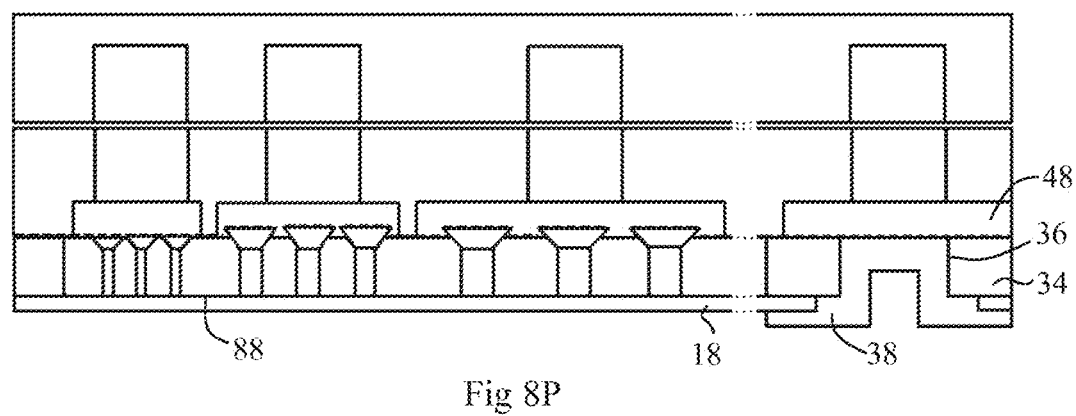
Figure 8Q:
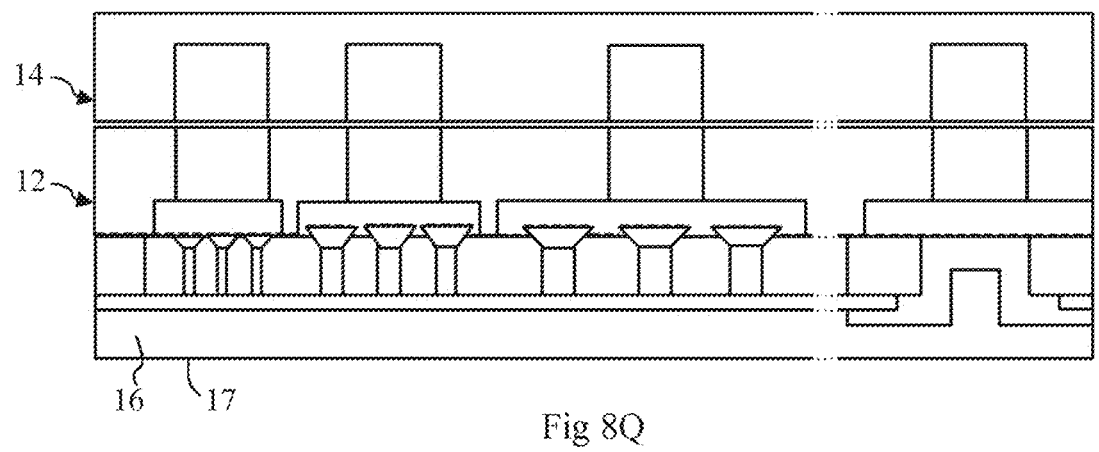

FIGS. 8A to 8Q are partial simplified cross-section views of the structures obtained at successive steps of another embodiment of a method of manufacturing optoelectronic device 10 shown in FIG. 1.

FIG. 8A shows the structure obtained after the steps of:

forming a support 70 corresponding to the stacking, from bottom to top in FIG. 8A, of a substrate 71, at least of a nucleation layer, also called seed layer, two seed layers 72 and 73 being shown as an example in FIG. 8A, of an electrically-insulating layer 74, and of an electrically-insulating layer 76 on insulating layer 74, insulating layers 74, 76 being made of different materials;

forming first openings 78 in insulating layers 74 and 76 to expose portions of seed layer 73 at the desired locations of first wires 20, the diameter of the first openings 78 substantially corresponding to the diameter of the first wires 20, second openings 80 in insulating layers 74 and 76 to expose portions of seed layer 73 at the desired locations of second wires 22, the diameters of the second openings 80 substantially corresponding to the diameter of the second wires 22, and third openings 82 in insulating layers 74 and 76 to expose portions of seed layer 73 at the desired locations of the third wires 24, the diameter of third openings 82 substantially corresponding to the diameter of the third wires 24; and simultaneously growing wires 20, 22, 24 from seed layer 72 in openings 78, 80, 82.

As a variation, insulating layers 74, 76 may be replaced with a single insulating layer.

Substrate 71 may correspond to a monoblock structure or correspond to a layer covering a support made of another material. Substrate 71 is preferably a semiconductor substrate, for example, a substrate made of silicon, of germanium, of silicon carbide, of a III-V compound, such as GaN or GaAs, or a ZnO substrate, or a conductive substrate, for example, a substrate made of a metal or a metal alloy, particularly copper, titanium, molybdenum, a nickel-based alloy, and steel. Preferably, substrate 71 is a single-crystal silicon substrate. Preferably, it is a semiconductor substrate compatible with manufacturing methods implemented in microelectronics. Substrate 71 may correspond to a multi-layer structure of silicon-on-insulator type, also called SOI. Substrate 71 may be heavily doped, lightly-doped, or non-doped.

Seed layers 72, 73 are made of a material which favors the growth of wires 20, 22, 24. The material forming each seed layer 72, 73 may be a metal, a metal oxide, a nitride, a carbide, or a boride of a transition metal of column IV, V, or VI of the periodic table of elements or a combination of these compounds and preferably a nitride of a transition metal of column IV, V, or VI of the periodic table of elements or a combination of these compounds. As an example, each seed layer 72, 73 may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbide nitride (TaCN), of magnesium nitride in $Mg_xN_y$ form, where x is approximately equal to 3 and y is approximately equal to 2, for example, magnesium nitride in $Mg_3N_2$ form. Each seed layer 72, 73 has, for example, a thickness in the range from 1 nm to 100 nm, preferably in the range from 10 nm to 30 nm.

Each of insulating portions 74 and 76 may be made of a material selected from the group comprising silicon oxide ($SiO_2$), silicon nitride ($Si_xN_y$, where x is approximately equal to 3 and y is approximately equal to 4, for example, $Si_3N_4$), silicon oxynitride (particularly of general formula $SiO_xN_y$, for example, $Si_2ON_2$), hafnium oxide ($HfO_2$), or aluminum oxide ($Al_2O_3$). According to an embodiment, insulating layer 74 is made of silicon oxide and insulating layer 76 is made of silicon nitride. The thickness of each insulating layer 74, 76 is in the range from 10 nm to 100 nm, preferably from 20 nm to 60 nm, particularly equal to approximately 40 nm.

The method of growing wires 20, 22, 24 may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. Further, electrochemical processes may also be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or dimethylhydrazine (UDMH).

The height of each wire 20, 22, 24 at the end of the growth step may be in the range from 250 nm to 15 µm, preferably from 500 nm to 5 µm, more preferably from 1 µm to 3 µm.

The height of first wires 20 is different from the height of second wires 24 and from the height of third wires 24. The height of wires 20, 22, 24 particularly depends on the wire diameter and on the distance between wires. According to an embodiment, the height of the first wires 20 is greater than the height of the second wires 22 and the height of the second wires 22 is greater than the height of the third wires 24.

Each seed layer 72, 73 and each insulating layer 74, 76 may be deposited as an example by plasma-enhanced chemical vapor deposition (PECVD), low-pressure chemical vapor deposition (LPCVD), sub-atmospheric chemical vapor deposition (SACVD), CVD, physical vapor deposition (PVD), or atomic layer deposition (ALD).

FIG. 8B shows the structure obtained after having deposited a dielectric layer 83 over all the wires 20, 22, 24 and over insulating layer 76 between wires 20, 22, 24.

Dielectric layer 83 may be made of the same material as insulating layer 74, that is, of a material different from that of insulating layer 76. According to an embodiment, the minimum thickness of layer 83 is greater than the height of the smallest wires 20, 22, 24. Preferably, the minimum thickness of layer 83 is greater than the height of the largest wires 20, 22, 24.

As an example, the thickness of dielectric layer 83 is in the range from 250 nm to 15 µm, preferably from 300 nm to 5 µm, for example, equal to approximately 2 µm. Insulating layer 83 may be formed by the same methods as those used to form insulating layers 72, 74.

FIG. 8C shows the structure obtained after having thinned and planarized insulating layer 83 and a portion of wires 20, 22, 24 to delimit a planar surface 84 at a height of seed layer 76 for example in the range from 150 nm to 10 µm. The etching is for example a CMP (Chemical-Mechanical Planarization). The presence of insulating layer 83 between wires 20, 22, 24 enables to implement a CMP-type etch method, which would be difficult or even impossible if only the wires were present. After this step, all wires 20, 22, 24 have the same height. The etching of insulating layer 83 and of a portion of wires 20, 22, 24 may be carried out in a plurality of steps. As a variation, the step of thinning and of planarization of insulating layer 83 and of a portion of wires 20, 22, 24 may be omitted when wires 20, 22, 24 have substantially the same height.

FIG. 8D shows the structure obtained after having totally removed dielectric layer 83 to expose insulating layer 76 and wires 20, 22, 24. Insulating layer 76 may then play the role of a stop layer during the etching of dielectric layer 83. The removal of dielectric layer 83 may be performed by a wet etching. As a variation, the etching of dielectric layer 83 may be only partial, a residual layer being kept on insulating layer 76.

FIG. 8E shows the structure obtained after the simultaneous forming of heads 26, 28, 30 for each wire 20, 22, 24. The successive layers forming the heads may be formed by the same methods as those described for the forming of wires 20, 22, 24. Such methods are described in Katsumi Kishino et al.'s publication entitled "Monolithic Integration of InGaN-Based Nanocolumn Light-Emitting Diodes with Different Emission Colors" (2013, The Japan Society of Applied Physics, Applied Physics Express 6 (2013) 012101) and Yong-Ho Ra's publication entitled "Full-Color Single Nanowire Pixels for Projection Displays".

The forming of the active areas of heads 26, 28, 30 may comprise, in addition to the injection into the reactor of a precursor of a group-III element and of a precursor of a group-V element, a precursor of an additional element, particularly indium. The rate of incorporation of the additional element into active area 66 particularly depends on the lateral dimensions of the active areas, on the distance between wires 20, 22, 24, on the height of the active areas relative to the upper surface of dielectric layer 83 (if the latter is not totally etched) or insulating layer 76 (if dielectric layer 83 is totally etched). Different indium incorporation rates are thus obtained for the active areas of heads 26, 28, 30, although they are formed simultaneously. In operation, heads 26 28, 30 are then capable of emitting electromagnetic radiations at different wavelengths.

If dielectric layer 83 was maintained between wires 20, 22, 24, the methods implemented to form heads 26, 28, 30 might also cause the forming of unwanted crystals on dielectric layer 83. The at least partial removal of dielectric layer 83 results in little forming of parasitic crystals on the lateral walls the wires and at the foot of the wires, particularly due to the shield effect due to the wire assembly.

FIG. 8F shows the structure obtained after the steps of:
forming insulating layer 32;
forming insulating layer 34; and
etching or thinning insulating layer 34 across part of its thickness to delimit a substantially planar surface 86.

Insulating layer 32 may be formed by conformal deposition, for example, by LPCVD. The method of forming insulating layer 32 is preferably carried out at a temperature smaller than 700° C. to avoid damaging the active areas of the light-emitting diodes. Further, a method of LPCVD type enables to obtain a good filling between wires 20, 22, 24. The deposited thickness of insulating layer 32 may be in the range from 50 nm to 500 nm, for example, approximately 150 nm. Insulating layer 34 may for example be formed by conformal deposition, for example, by PECVD. The deposited thickness of insulating layer 34 may be greater than or equal to 2 µm. The partial etching of insulating layer 34 may be performed by CMP. The etching may be stopped in insulating layer 34, as shown in FIG. 8F, in insulating layer 32 but anyway before exposing heads 26, 28, 30.

FIG. 8G shows the structure obtained after having etched insulating layers 32, 34, to expose the upper surfaces of heads 26, 28, 30. The etching is for example an etching of reactive ion etching type (RIE) or an inductively coupled plasma etching (ICP). Since heads 26, 28, 30 may have different dimensions, some heads 26, 28, 30 may be more exposed than others. Heads 26, 28, 30 are not etched at this step. The etching is preferably an anisotropic etching. Portions, not shown, of layer 32 may be kept on the lateral walls of heads 26, 28, 30. The layer located at the top of heads 26, 28, 30 plays the role of an etch stop layer. According to an embodiment, on forming of heads 26, 28, 30, an additional layer is added at the top of heads 26, 28, 30 to play the role of an etch stop layer. It may be an AlN layer.

FIG. 8H shows the structure obtained after the steps of:
when etch stop layers are present on heads 26, 28, 30, removing the etch stop layers; and
forming metal portions 40 on the exposed portions of heads 26, 28, 30, on insulating layer 32, and on insulating layer 34.

When the etch stop layers on heads 26, 28, 30 are made of AlN, they may be removed by an etching of tetramethylammonium hydroxide type (TMAH). The forming of metal portions 40 may successively comprise the deposition of a metal layer having a 1-nm thickness, for example, nickel, and a thermal anneal step, for example, at a 550° C. temperature, which results in the forming of separate portions 40.

FIG. 8I shows the structure obtained after the steps of:
depositing a metal layer on the structure shown in FIG. 8H, for example, by cathode sputtering, for example having a 0.5-µm thickness;
etching the layer to delimit conductive layers 42, 44, 46, 48.

FIG. 8J shows the structure obtained after the steps of:
depositing insulating layer 50 over the structure shown in FIG. 8I; and
forming conductive pads 52, 54, 56, 58, for example, made of copper.

FIG. 8K shows the structure obtained after having bonded control chip 14 to optoelectronic chip 12. The bonding of control chip 14 to optoelectronic chip 12 may be performed by using inserts such as connection microballs, not shown. As a variation, the bonding of control chip 14 to the optoelectronic chip may be performed by direct bonding, without using inserts. The direction bonding may comprise a direct metal-to-metal bonding of metal areas, particularly the conductive pads 62 of control chip 14, and of metal areas, particularly the conductive pads 52, 54, 56, 58 of optoelectronic chip 12, and a dielectric-to-dielectric bonding of dielectric areas, particularly the insulating layer 50 of control chip 14, and of dielectric areas, particularly the insulating layer 50 of optoelectronic chip 12. The bonding of control chip 14 to optoelectronic chip 12 may be performed by a thermocompression method where optoelectronic chip 12 is pressed against control chip 14 with the application of a pressure and of a heating.

FIG. 8L shows the structure obtained after having removed substrate 71 and seed layers 72, 73. The removal of substrate 71 may be performed by grinding and/or by wet etching. The removal of seed layers 72, 73 may be performed by wet etching, dry etching, or by CMP. Insulating layer 74 or 76 may play the role of an etch stop layer during the etching of seed layer 73.

FIG. 8M shows the structure obtained after having etched insulating layers 74 and 76, after having partially etched insulating layer 32, insulating layer 34, and wires 20, 22, 24 to delimit a substantially planar surface 88. This removal step may be performed by CMP. The remaining height of wires 20, 22, 24 is equal to height H, for example, approximately 0.5 µm.

FIG. 8N shows the structure obtained after having formed conductive layer 18 on surface 88, for example, by depositing a TCO layer over the entire surface 88, for example having a 50-nm thickness, and by etching this layer by photolithography techniques to only keep TCO layer 18.

FIG. 8O shows the structure obtained after having etched opening 36 in insulating layer 34 across the entire thickness of insulating layer 34 to expose conductive layer 48. This may be performed by photolithography techniques.

FIG. 8P shows the structure obtained after having formed conductive layer 38 in opening 36 and on surface 88 in contact with conductive layer 18. This may be done by depositing a stack of conductive layers, for example, of Ti/TiN/AlCu type, over the entire structure on the side of surface 88 and by etching this layer by photolithography techniques to only keep conductive layer 38.

FIG. 8Q shows the structure obtained after having formed the insulating layer on conductive layer 18 delimiting surface 17. It for example is a SiON layer deposited by PECVD with a 1-µm thickness.

An additional step of forming raised areas on surface 17, also called texturing step, may be provided to increase the extraction of light.

The decrease in the wire height from the back side may be achieved by a CMP-type method, as previously described, or by any other dry etching or wet etching method. The obtained height of the wires, particularly made of GaN, may be selected to increase the extraction of light from the foot of the wire by optical interactions within the wire itself. Further, this height may be selected to favor the optical coupling between the different wires and thus to increase the collective emission of an assembly of wires.

According to another embodiment of a method of manufacturing the optoelectronic device, heads 26, 28, 30 are not formed simultaneously on all wires 20, 22, 24 but sequentially, with three growth steps during which the wires at the top of which heads should not be formed are masked. Wires 20, 22, 24 may then all have the same diameter and the same pitch between wires, the active areas being formed with different properties, for example, with different proportions of indium, to obtain emissions at different wavelengths.

Specific embodiments have just been described. Different variations and modifications will occur to those skilled in the art. Three-dimensional semiconductor structures capable of emitting a light radiation from an electric signal, thus forming light-emitting diodes, have been described. As a variation, the structures may be capable of detecting an incident light radiation and of generating as a response an electric signal, thus forming a photodiode. The applications may concern the optoelectronics or photovoltaics field.

The invention claimed is:

1. A method of manufacturing an optoelectronic device comprising a first optoelectronic circuit bonded to a second electronic circuit, the second electric circuit comprising electrically-conductive pads, the first optoelectronic circuit comprising pixels and comprising, for each pixel:
   a first electrically-conductive layer;
   at least first and second three-dimensional semiconductor elements extending perpendicularly to the first electrically-conductive layer and in contact with the first electrically-conductive layer and having the same height measured perpendicularly to the first electrically-conductive layer;
   first active areas resting on the ends of the first three-dimensional semiconductor elements opposite to the first electrically-conductive layer and capable of emitting or of receiving a first electromagnetic radiation at a first wavelength;
   second active areas resting on the ends of the second three-dimensional semiconductor elements opposite to the first electrically-conductive layer and capable of emitting or of receiving a second electromagnetic radiation at a second wavelength different from the first wavelength; and
   second, third, and fourth electrically-conductive layers electrically coupled to the electrically-conductive pads, the second electrically-conductive layer being coupled to the first active areas, the third electrically-conductive layer being coupled to the second active areas and the fourth electrically-conductive layer being coupled to the first electrically-conductive layer,
   the method comprising the successive steps of:
   a) forming the first optoelectronic circuit;
   b) bonding the first optoelectronic circuit to a second electronic circuit by electrically coupling the second, third, and fourth electrically-conductive layers to the electrically-conductive pads,
   wherein step a) comprises the successive steps of:
   c) simultaneously forming on a support the first and second three-dimensional semiconductor elements;
   d) forming an electrically-insulating layer between the first three-dimensional semiconductor elements and between the second three-dimensional semiconductor elements;
   e) partially etching the electrically-insulating layer and the first and second three-dimensional semiconductor elements so that the first and second three-dimensional semiconductor elements have the same height;
   f) simultaneously forming the first active areas on the ends of the first three-dimensional semiconductor elements opposite to the support and the second active areas on the ends of the second three-dimensional semiconductor elements opposite to the support;
   g) forming the second, third, and fourth electrically-conductive layers;
   wherein the following steps occur after step (b)
   h) removing the support; and
   i) forming the first electrically-conductive layer.

2. The method of claim 1, further comprising, between steps h) and i), the step of etching the electrically-insulating layer and first and second three-dimensional semiconductor elements on the side opposite to the first and second active areas.

3. The method of claim 1, wherein the diameter of each first semiconductor element in contact with the first electrically-conductive layer is smaller than the diameter of each second semiconductor element in contact with the first electrically-conductive layer.

4. The method of claim 1, wherein the first three-dimensional semiconductor elements are regularly distributed according to a first mean pitch and wherein the second three-dimensional semiconductor elements are regularly distributed according to a second mean pitch different from the first mean pitch.

5. The method of claim 1, wherein the first optoelectronic circuit further comprises, for each pixel:
   at least third three-dimensional semiconductor elements extending perpendicularly to the first electrically-conductive layer and in contact with the first electrically-conductive layer, the first, second, and third three-dimensional semiconductor elements having the same height measured perpendicularly to the first electrically-conductive layer;
   third active areas resting on the ends of the third three-dimensional semiconductor elements opposite to the first electrically-conductive layer and capable of emitting or of receiving an electromagnetic radiation at a third wavelength different from the first and second wavelengths; and
   a fifth electrically-conductive layer electrically coupled to one of the electrically-conductive pads and coupled to the third active areas.

6. The method of claim 5, wherein the diameter of each second semiconductor element in contact with the first electrically-conductive layer is smaller than the diameter of each third semiconductor element in contact with the first electrically-conductive layer.

7. The method of claim 5, wherein the third three-dimensional semiconductor elements are regularly distributed according to a third mean pitch different from the first mean pitch and from the second mean pitch.

8. The method of claim 1, wherein the first and second active areas comprise a single quantum well or multiple quantum wells.

9. The method of claim 1, wherein the first and second three-dimensional semiconductor elements are mainly made of a semiconductor material selected from the group comprising III-V compounds, II-VI compounds, or group-IV semiconductors or compounds.

10. The method of claim 1, wherein the first and second three-dimensional semiconductor elements have a wire, conical, or frustoconical shape.

11. The method of claim 1, wherein the maximum dimension of each pixel measured parallel to the first electrically-conductive layer is smaller than 5 μm.

12. The method of claim 1, wherein the first and second three-dimensional semiconductor elements have a wire, conical, or frustoconical shape, wherein the diameter of each first semiconductor element in contact with the first electrically-conductive layer is smaller than the diameter of each second semiconductor element in contact with the first electrically-conductive layer, wherein the first and second active areas comprise a single quantum well or multiple quantum wells and wherein the wavelength of the radiation emitted by the first active areas is greater than the wavelength of the radiation emitted by the second active areas.

* * * * *